United States Patent
Tsukamoto (10) Patent No.: US 8,382,257 B2
(45) Date of Patent: Feb. 26, 2013

(54) PIEZOELECTRIC ACTUATOR, METHOD OF MANUFACTURING PIEZOELECTRIC ACTUATOR, LIQUID EJECTION HEAD, METHOD OF MANUFACTURING LIQUID EJECTION HEAD AND IMAGE FORMING APPARATUS

(75) Inventor: Ryuji Tsukamoto, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 175 days.

(21) Appl. No.: 12/726,169

(22) Filed: Mar. 17, 2010

(65) Prior Publication Data

US 2010/0238216 A1    Sep. 23, 2010

(30) Foreign Application Priority Data

Mar. 19, 2009   (JP) ................. 2009-068556

(51) Int. Cl.
*B41J 2/045*    (2006.01)
(52) U.S. Cl. ............... 347/68; 347/54; 347/71
(58) Field of Classification Search .................. 347/48, 347/54, 62, 68, 70, 71
See application file for complete search history.

(56) References Cited

U.S. PATENT DOCUMENTS

| 4,584,590 A | 4/1986 | Fischbeck et al. |
| 5,202,703 A * | 4/1993 | Hoisington et al. ............ 347/68 |
| 6,045,208 A * | 4/2000 | Hirahara et al. ................ 347/10 |
| 7,380,916 B2 * | 6/2008 | Sugahara ........................ 347/68 |

FOREIGN PATENT DOCUMENTS

| JP | 2003-347618 | 5/2003 |
| JP | 2004-136461 | 5/2004 |
| JP | 2004-223979 | 12/2004 |
| JP | 2006015764 A | 1/2006 |
| JP | 2008-254206 | 10/2008 |

OTHER PUBLICATIONS

Office Action dated Oct. 22, 2012 issued in Japanese application No. 2009-068556, 4 pgs.

* cited by examiner

*Primary Examiner* — Juanita D Jackson
(74) *Attorney, Agent, or Firm* — Fish & Richardson P.C.

(57) ABSTRACT

A piezoelectric actuator includes: a piezoelectric layer formed by a film formation method so as to have orientation in a prescribed orientation direction; and a pair of electrodes, disposed on a same surface which is substantially perpendicular to the orientation direction of the piezoelectric layer, for applying to the piezoelectric layer an electric field in a direction substantially perpendicular to the orientation direction.

13 Claims, 10 Drawing Sheets

PIEZOELECTRIC ACTUATOR, METHOD OF MANUFACTURING PIEZOELECTRIC ACTUATOR, LIQUID EJECTION HEAD, METHOD OF MANUFACTURING LIQUID EJECTION HEAD AND IMAGE FORMING APPARATUS

BACKGROUND OF THE INVENTION

1. Field of the Invention

The present invention relates to a piezoelectric actuator, a method of manufacturing a piezoelectric actuator, a liquid ejection head having the piezoelectric actuator, a method of manufacturing a liquid ejection head and an image forming apparatus.

2. Description of the Related Art

Japanese Patent Application Publication No. 2006-15764 discloses using a piezoelectric body formed by laminating together a piezoelectric ceramics layer and an outer side piezoelectric ceramics layer which are polarized in the thickness direction, and increasing the deformation of the piezoelectric body as a whole by coordinating shear mode deformation of the piezoelectric ceramics layer and extension mode deformation of the outer side piezoelectric ceramics layer by causing the piezoelectric ceramics layer to deform in a shear mode by generating an electric field perpendicularly to the polarization direction of the piezoelectric ceramics layer when voltage is applied, as well as causing the outer side piezoelectric ceramics layer to deform in an extension mode by generating an electric field parallel to the direction of polarization of the outer side piezoelectric ceramics layer.

U.S. Pat. No. 4,584,590 discloses an inkjet head in which a piezoelectric layer is fixed to the open end side of a pressure chamber formed in an ink jet ejector body, electrodes are formed on both surfaces of the piezoelectric layer at a position corresponding to the pressure chamber, and electrodes are also formed on both surfaces of the piezoelectric layer at a position corresponding to a peripheral position apart from the pressure chamber. In U.S. Pat. No. 4,584,590, the piezoelectric layer is polarized in the transverse direction of the layer, in such a manner that a shear mode deformation is produced in the piezoelectric layer by generating an electric field in a direction orthogonal to the direction of polarization.

The inkjet head described in Japanese Patent Application Publication No. 2006-15764 uses a piezoelectric ceramics layer in which polarization processing is carried out after forming a layer by calcination of ceramic. When the piezoelectric ceramics layer as described above is driven in shear mode, then an electric field is applied in the direction orthogonal to the direction of polarization of the piezoelectric ceramics layer, and hence there is a possibility that the polarization direction changes readily and the amount of displacement of the piezoelectric ceramics layer deteriorates. Furthermore, in the U.S. Pat. No. 4,584,590, an electric field is applied to the direction orthogonal to the direction of polarization of the piezoelectric layer. Therefore, if a piezoelectric ceramics layer is used as the piezoelectric layer, there is a possibility that the direction of polarization changes readily and the amount of displacement deteriorates. Consequently, in a piezoelectric layer formed by calcination of ceramic, it is difficult to obtain a piezoelectric actuator having high reliability.

Moreover, since the piezoelectric ceramics layer formed by calcination of ceramics has lower voltage tolerance, then it is difficult to increase the amount of displacement of the piezoelectric ceramics layer by raising the applied voltage value.

SUMMARY OF THE INVENTION

The present invention has been contrived in view of these circumstances, an object thereof being to provide a piezoelectric actuator having high durability whereby deterioration of the amount of displacement can be suppressed, a method of manufacturing a piezoelectric actuator, a liquid ejection head comprising the piezoelectric actuator, a method of manufacturing a liquid ejection head, and an image forming apparatus.

In order to attain an object described above, one aspect of the present invention is directed to a piezoelectric actuator, comprising: a piezoelectric layer formed by a film formation method so as to have orientation in a prescribed orientation direction; and a pair of electrodes, disposed on a same surface which is substantially perpendicular to the orientation direction of the piezoelectric layer, for applying to the piezoelectric layer an electric field in a direction substantially perpendicular to the orientation direction.

According to the first mode described above, by employing a piezoelectric body formed so as to have orientation by a film formation method (for example, a sputtering method), it is possible to prevent the direction of polarization from changing readily even when the piezoelectric body is driven repeatedly. Consequently, it is possible to achieve a piezoelectric actuator having high durability and a stable amount of displacement of the diaphragm, and a liquid ejection head comprising this piezoelectric actuator. Moreover, the piezoelectric body formed so as to have orientation by sputtering has high voltage tolerance and therefore the voltage applied to the piezoelectric actuator is raised (desirably, 3 kV/mm or above, 25 kV/mm or lower) and the amount of displacement of the diaphragm can be increased.

Desirably, the piezoelectric layer is provided on a diaphragm; and the pair of electrodes is disposed on a surface on an opposite side of the piezoelectric layer from the diaphragm.

Desirably, of the diaphragm, at least a surface on which the piezoelectric layer is disposed has an insulation property.

Desirably, the pair of electrodes includes an inner electrode and an outer electrode provided so as to encompass the inner electrode.

Desirably, a central location of the inner electrode coincides with a central location of the outer electrode.

In order to attain an object described above, another aspect of the present invention is directed to a liquid ejection head, comprising: a plurality of pressure chambers disposed in a plane; and piezoelectric actuators which change volume of the plurality of pressure chambers respectively so as to apply pressure to liquid inside the plurality of pressure chambers respectively, wherein: the piezoelectric actuators each have: a piezoelectric layer formed by a film formation method so as to have orientation in a prescribed orientation direction; and a pair of electrodes, disposed on a same surface which is substantially perpendicular to the orientation direction of the piezoelectric layer, for applying to the piezoelectric layer an electric field in a direction substantially perpendicular to the orientation direction.

According to this mode described above, it is possible to raise the durability of the piezoelectric actuator and suppress degradation of the amount of displacement, and a liquid ejection head having high durability and a stable liquid ejection amount can be created.

Desirably, the piezoelectric layer is provided on a diaphragm; the pair of electrodes is arranged on a surface on an opposite side of the piezoelectric layer from the diaphragm; and the diaphragm constitutes one wall face of the plurality of pressure chambers.

Desirably, the piezoelectric layer constitutes one wall face of the plurality of pressure chambers.

According to this mode, the piezoelectric layer is not constricted by the diaphragm and therefore the amount of displacement of the piezoelectric layer can be increased further.

Desirably, the pair of electrodes comprises a ring-shaped first electrode having a substantially similar shape to the corresponding pressure chamber when viewed from a face perpendicular to the plane, and a second electrode arranged on an inner side of the first electrode when viewed from the face perpendicular to the plane.

Desirably, of the diaphragm, at least a surface on which the piezoelectric layer is disposed has an insulation property.

Desirably, the pair of electrodes includes: an inner electrode provided on a first region of the piezoelectric layer which corresponds to a central region of the corresponding pressure chamber; and an outer electrode provided on a second region of the piezoelectric layer which corresponds to a region other than the central region of the corresponding pressure chamber.

Desirably, when viewed in a direction perpendicular to the plane, a shape of each of the plurality of pressure chambers is substantially similar to a shape of the pair of electrodes.

In order to attain an object described above, another aspect of the present invention is directed to an image forming apparatus, comprising: any one of the liquid ejection heads defined above; a voltage application device which applies a voltage to the pair of electrodes; and a voltage control device which controls the voltage applied to the pair of electrodes in such a manner that intensity of an electric field generated in the piezoelectric element is 3 kV/mm or greater and 25 kV/mm or lower.

According to this mode described above, it is possible to apply a high voltage compared to a piezoelectric ceramics formed by a calcination method, and therefore the amount of displacement of the piezoelectric element can be increased. By this means, it is possible to achieve high density in a liquid ejection head.

In order to attain an object described above, another aspect of the present invention is directed to a method of manufacturing a piezoelectric actuator, comprising the steps of: forming a piezoelectric layer by a film formation method so as to have orientation in a prescribed orientation direction; and forming a pair of electrodes, disposed on a same surface which is substantially perpendicular to the orientation direction of the piezoelectric layer, for applying to the piezoelectric layer an electric field in a direction substantially perpendicular to the orientation direction.

Desirably, the piezoelectric layer is provided on a diaphragm; and the pair of electrodes is disposed on a surface on an opposite side of the piezoelectric layer from the diaphragm.

Desirably, the film formation method is based on sputtering.

In order to attain an object described above, another aspect of the present invention is directed to a method of manufacturing a liquid ejection head having a plurality of pressure chambers disposed in a plane, and piezoelectric actuators which change volume of the plurality of pressure chambers respectively so as to apply pressure to liquid inside the plurality of pressure chambers, the method comprising the steps of: forming a piezoelectric layer by a film formation method so as to have orientation in a prescribed orientation direction; and forming a pair of electrodes, disposed on a same surface which is substantially perpendicular to the orientation direction of the piezoelectric layer, for applying to the piezoelectric layer an electric field in a direction substantially perpendicular to the orientation direction.

Desirably, the piezoelectric layer is provided on a diaphragm; the pair of electrodes is arranged on a surface on an opposite side of the piezoelectric layer from the diaphragm; and the diaphragm constitutes one wall face of the plurality of pressure chambers.

Desirably, the piezoelectric layer constitutes one wall face of the plurality of pressure chambers.

Desirably, the film formation method is based on sputtering.

According to the present invention, by employing a piezoelectric body formed so as to have orientation by a film formation method (for example, a sputtering method), it is possible to prevent the direction of polarization from changing readily even when the piezoelectric body is driven repeatedly. Consequently, it is possible to achieve a piezoelectric actuator having high durability and a stable amount of displacement of the diaphragm, and a liquid ejection head comprising this piezoelectric actuator. Moreover, the piezoelectric body formed so as to have orientation by sputtering has high voltage tolerance and therefore the voltage applied to the piezoelectric actuator is raised (for example, 3 kV/mm or higher, 25 kV/mm or lower) and the amount of displacement of the diaphragm can be increased.

BRIEF DESCRIPTION OF THE DRAWINGS

(a) and (b) of FIG. 4 indicate diagrams showing a liquid ejection head relating to one embodiment of the present invention.

DESCRIPTION OF THE PREFERRED EMBODIMENTS

Below, preferred embodiments of a piezoelectric actuator, a method of a manufacturing a piezoelectric actuator, a liquid ejection head comprising the piezoelectric actuator, a method of manufacturing a liquid ejection head and an image forming apparatus according to the present invention will be described with reference to the accompanying drawings.

Composition of Image Forming Apparatus

Figure 1:
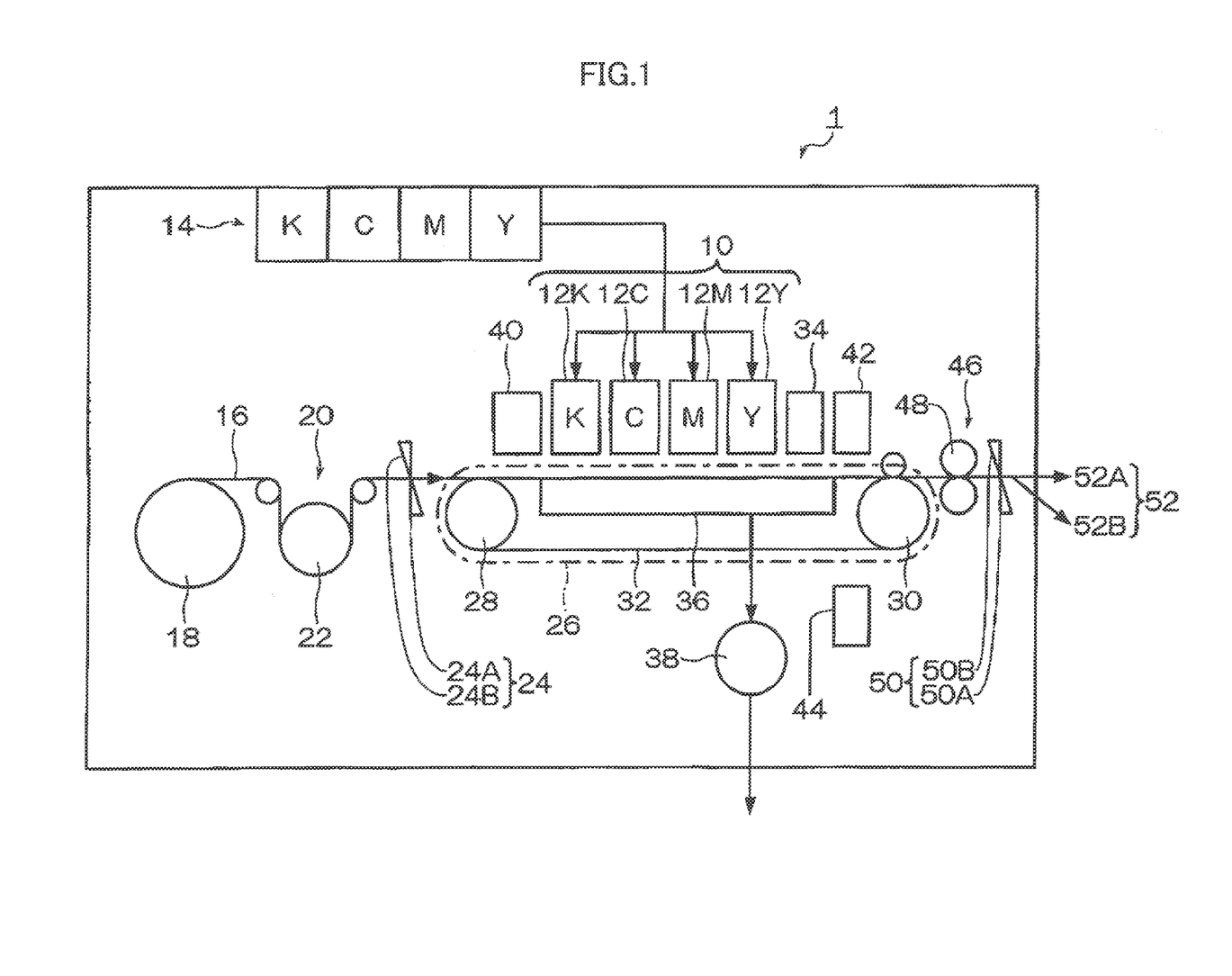
FIG. 1 is a schematic drawing of an inkjet recording apparatus relating to one embodiment of the present invention.

Firstly, the composition of the liquid ejection head and the image forming apparatus (inkjet recording apparatus) comprising a piezoelectric actuator relating to an embodiment of the present invention will be described. FIG. 1 is a diagram showing a schematic view of an inkjet recording apparatus relating to one embodiment of the present invention, and FIG. 2 is a plan diagram showing the periphery of the print unit of the inkjet recording apparatus.

Figure 3:
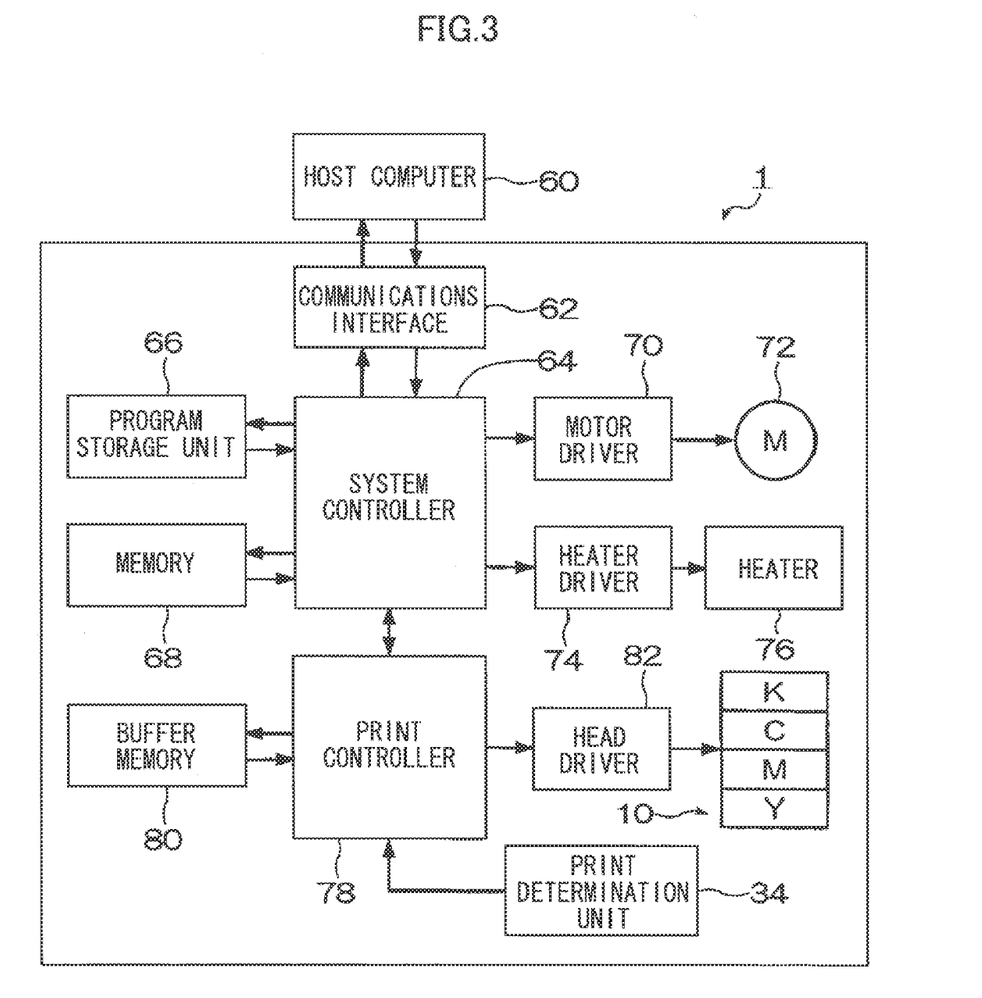
FIG. 3 is a block diagram showing the control system of an inkjet recording apparatus.

As shown in FIG. 1, the inkjet recording apparatus 1 relating to the present embodiment comprises a print unit 10 having liquid ejection heads 12K, 12C, 12M and 12Y which respectively eject inks of the four colors of black (K), cyan (C), magenta (M) and yellow (Y), and forms a color image by ejecting inks of the four colors onto the printing surface of recording paper 16 from the print unit 10, on the basis of image data input from a host computer (reference numeral 60 in FIG. 3).

Figure 2:
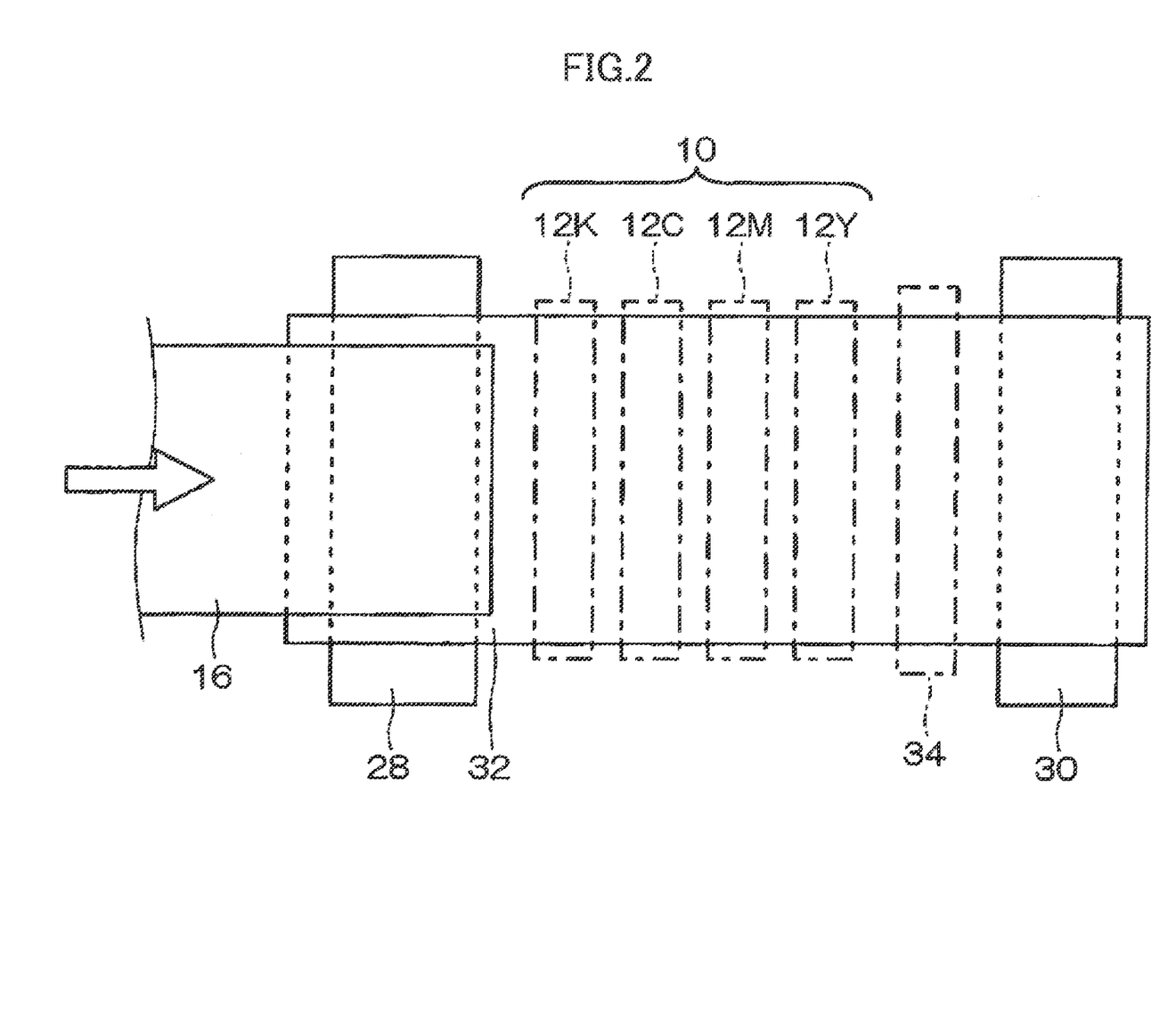
FIG. 2 is a plan diagram showing the main composition of the peripheral area of a print unit of an inkjet recording apparatus.

As shown in FIG. 2, the print unit 10 is a so-called full line type of head in which line type liquid ejection heads 12K, 12C, 12M and 12Y having a length corresponding to the maximum paper width of the recording paper 16 are arranged in a direction (main scanning direction) which is perpendicular to the paper conveyance direction (sub-scanning direction).

The ink storing and loading unit 14 stores inks of the respective colors of K, C, M and Y. The inks stored in the ink storing and loading unit 14 are supplied to the liquid ejection heads 12 via ink supply channels.

The ink colors and the number of colors are not limited to the standard (four) colors of K, C, M and Y described above, and it is also possible to add liquid ejection heads which eject light inks or dark inks, for example. For instance, it is possible to add liquid ejection heads which eject light inks, such as light cyan, light magenta, or the like.

The paper supply unit 18 supplies recording paper 16 to the print unit 10. The paper supply unit comprises a magazine for rolled paper (continuous paper). A plurality of magazines for different paper widths and different paper qualities, and the like, may be provided. Furthermore, it is also possible to provide a cassette in which cut paper is stacked.

The decurling unit 20 removes the traces of winding (curl) in the recording paper 16, by heating the recording paper 16 which is paid out from the paper supply unit 18, by means of a heating drum 22. During decurling, it is desirable to control the heating temperature and to apply a slight outward curl to the printed surface.

The cutter 24 comprises a fixed blade 24A which is disposed on the rear surface side of the print surface of the recording paper 16 and a circular blade 24B which is disposed on the print surface side. The recording paper 16 paid out from the paper supply unit 18 is cut to a desired size by a cutter 24. Decurling is carried out by the decurling unit 20 and the cut recording paper 16 is then supplied to the suction belt conveyance unit 26.

The suction belt conveyance unit 26 comprises two rollers 28 and 30, and an endless belt 32 which is wound between the rollers 28 and 30. Drive force from a motor is transmitted to at least one of the rollers 28 and 30, thereby driving the belt 32 in the clockwise direction in FIG. 1. By this means, the recording paper 16 held on the surface of the belt 32 is conveyed from left to right in FIG. 1.

The rollers 28 and 30 and the belt 32 are disposed in such a manner that the portion facing the nozzle surfaces of the liquid ejection heads 12K, 12C, 12M and 12Y of the print unit 10 and the sensor surface of the print determination unit 34 is flat.

The width of the belt 32 is greater than the width of the recording paper 16 (see FIG. 2). A plurality of suction holes (not illustrated) are formed in the surface of the belt 32. A suction chamber 36 is provided at a position opposing the nozzle surface of the print unit 10 on the inner side of the belt 32 and the sensor surface of the print determination unit 34. The suction chamber 36 is set to a negative pressure by a fan 38. Thereby, the recording paper 16 is suctioned and held on the surface of the belt 32.

The heating unit 40 heats the recording paper 16 before printing, in order to shorten the time period from depositing ink onto the recording paper 16 until drying of the ink. A heating fan which applies heat by blowing heated air onto the recording paper 16, for example, is used as the heating unit 40.

The print determination unit 34 comprises an image sensor for capturing an image of the ink droplet ejection results of the print unit 10. As shown in FIG. 2, the print determination unit 34 is constituted by a line sensor having rows of photoreceptor elements with a width that is greater than the ink droplet ejection width (image recording width) of the print heads 12K, 12C, 12M and 12Y. It is possible to use area sensors, for example, as the print determination unit 34.

The post drying unit 42 is an apparatus which dries the print surface of the recording paper 16. A heating fan, for example, is used as the post drying unit 42.

The belt cleaning unit 44 removes ink which has adhered to the belt 32. As a method for cleaning the belt 32, it is possible to use, for example, a method which nips a brush roller and water absorbing roll, or the like, or an air blowing method which blows a cleaning air flow.

The heating and pressurizing unit 46 is an apparatus for controlling the glossiness of the surface of the image printed on the recording paper 16. The heating and pressurizing unit 46 is disposed after the post drying unit 42 and applies pressure to the printed surface by means of a pressurization roller 48 having a prescribed undulating surface form, while applying heat, thereby transferring the undulating form to the image surface.

As described above, the recording paper 16 (printed item) on which an image has been printed is output from the paper output unit 52. The inkjet recording apparatus 1 relating to the present embodiment comprises a sorting device (not illustrated) which switches the paper output path in order to sort a printed item on which an image intended for printing has been printed, and a printed item on which a test pattern for print result determination has been printed, and guide these to respective paper output units 52A and 52B.

If the main image and the test print are formed simultaneously in a parallel fashion, on the recording paper 16, then the portion corresponding to the test print is cut off by means of the cutter 50. The cutter 50 comprises a fixed blade 50A and a circular blade 50B, similarly to the cutter 24.

FIG. 3 is a block diagram showing the control system of the inkjet recording apparatus 1.

The system controller 64 is a control unit which controls the respective units of the inkjet recording apparatus 1. The system controller 64 is made up of a central processing unit (CPU) and peripheral circuits thereof, and as well as controlling communications with the host computer 60 and controlling reading from and writing to the memory 68, and the like, it generates control signals for controlling the motors 72 and the heaters 76.

The program storage unit 66 is a storage area in which control programs of various types are stored. For this program storage unit 66, it is possible to use, for example, a semiconductor memory such as a ROM or EEPROM, or a magnetic medium, such as a hard disk.

The memory 68 is a storage apparatus which includes a storage area for data of various types and a work area for the system controller 64 to carry out calculations. For this memory 68, it is possible to use, for example, a semiconductor memory such as a RAM, or a magnetic medium, such as a hard disk.

The communications interface 62 is an interface for providing a communications connection with the host computer 60. For the communications interface 62, it is possible to employ a serial interface, such as USB, IEEE 1394, or the like, a parallel interface such as Centronics, a wireless network, or an Ethernet (registered trademark). The image data input via the communications interface 62 is stored temporarily in the memory 68.

The print controller 78 generates a print control signal (dot data) by applying prescribed signal processing to the image data stored temporarily in the memory 68, in accordance with a control signal input from the system controller 64. The print controller 78 controls the head driver 82 on the basis of the print control signal, and thereby controls the ink ejection volume and ejection timing of the ink ejected from the liquid ejection heads 12K, 12C, 12M and 12Y of the print unit 10. Furthermore, the print controller 78 corrects the print control signal on the basis of the ink droplet ejection results obtained from the print determination unit 34. By this means, prescribed dot size and dot positions can be achieved.

The buffer memory 80 is a storage apparatus including a work area for the print controller 78 when processing the image data.

The head driver 82 generates drive signals for driving the print unit 10 (the respective liquid ejection heads 12K, 12C, 12M and 12Y) on the basis of the dot data input from the print controller 78, and supplies these drive signals to the respective liquid ejection heads 12K, 12C, 12M and 12Y.

The motor driver 70 drives the motor 72 in accordance with a control signal input from the system controller 64, and drive force is transmitted to the rollers 28 and 30 of the suction belt conveyance unit 26 and the conveyance of the recording paper 16 is thereby controller.

The heater driver 74 controls heating by the heater 76 (heating devices of various types including a decurling unit 20, a heating unit 40, a post drying unit 42 and a heating and pressurizing unit 46, and the like) in accordance with control signals input from the system controller 64.

Figure 4:
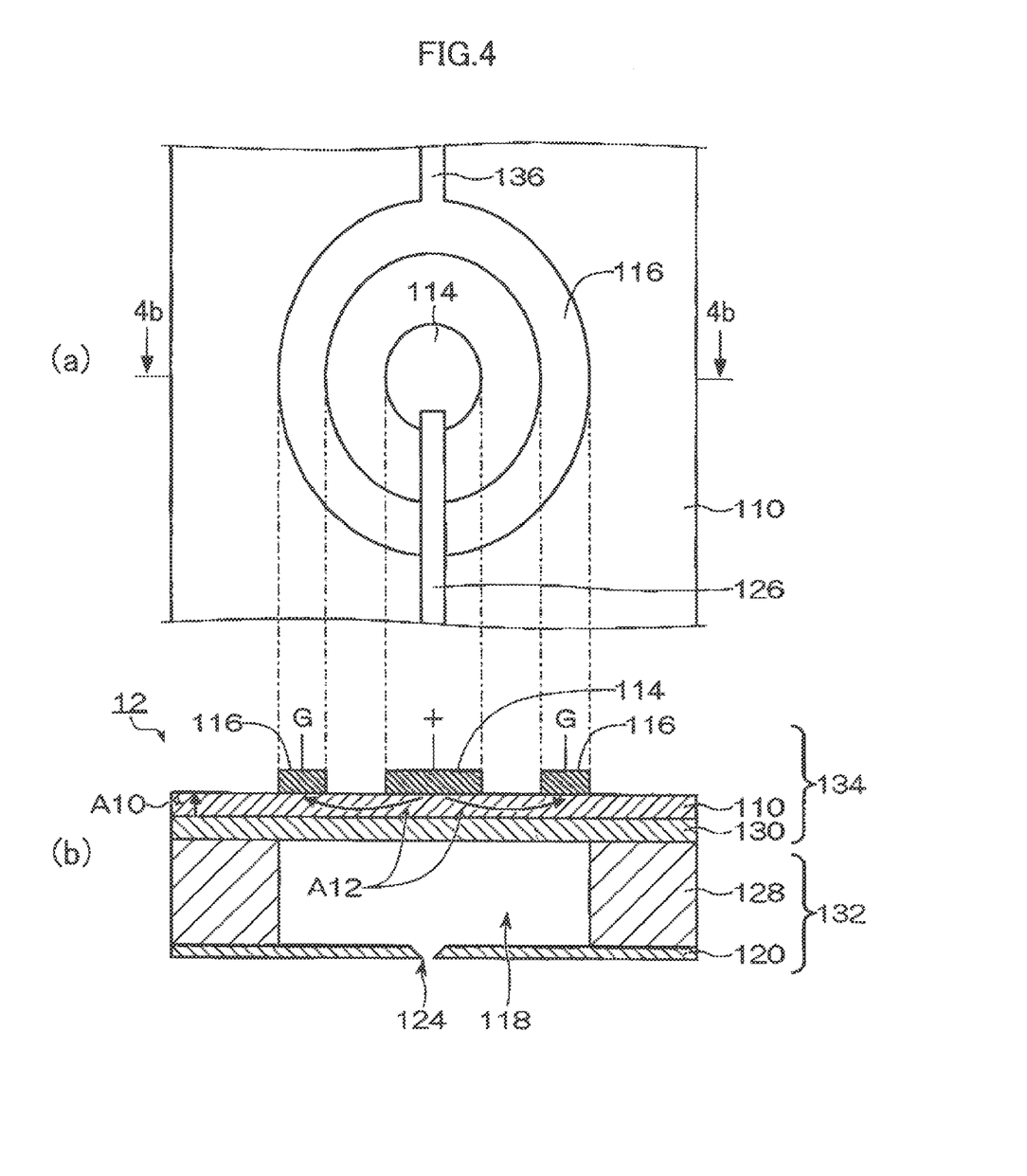

Composition of Liquid Ejection Head (a) and (b) of FIG. 4 are diagrams showing a liquid ejection head relating to one embodiment of the present invention. (a) of FIG. 4 is a plan diagram showing the upper surface of a liquid ejection head and (b) of FIG. 4 is a cross-section along 4b-4b in (a) of FIG. 4.

As shown in (b) of FIG. 4, the liquid ejection head comprises a flow channel unit 132 in which a pressure chamber 118 is formed, and a piezoelectric actuator 134 which applies pressure to the liquid (ink) inside the pressure chamber 118 by changing the volume of the pressure chamber 118.

The flow channel unit 132 is composed by laminating and bonding together a pressure chamber plate 128 and a nozzle plate 120. As the material of the pressure chamber plate 128, it is possible to use, for example, a silicon material, such as silicon (Si), silicon oxide ($SiO_2$), silicon nitride (SiN), quartz glass, or the like, or a metal material, such as stainless steel. Furthermore, as the material of the nozzle plate 120, it is possible to use a resin material such as polyimide, a metal material such as stainless steel, or silicon, for instance.

A plurality of pressure chambers (pressure chamber holes) 118 are formed in the pressure chamber plate 128. Each pressure chamber 118 has a substantially oval shape which has a long axis in the main scanning direction (a substantially elliptical shape) in plan view. The size of each pressure chamber 118 (length of the lengthwise direction) is 300 μm in diameter, for example.

Nozzles 124 are formed in the nozzle plate 120. The plurality of nozzles 124 are provided in a two-dimensional arrangement (matrix configuration) in the ejection face (nozzle surface) of the liquid ejection head 12. The nozzles 124 are formed, for example, by excimer laser processing of the nozzle plate 120.

The piezoelectric actuator 134 is constituted by a piezoelectric layer 110 formed on the surface of a diaphragm 130 which forms a wall face of the pressure chamber 118, and an address electrode 114 and a ground electrode 116 formed on the surface of the piezoelectric layer 110. By applying an electric field in a direction substantially perpendicular to the direction of orientation (direction of polarization) of the piezoelectric layer 110, which is arranged in a direction substantially perpendicular to the surface where the address electrode 114 and the ground electrode 116 are formed and generates a potential difference between the address electrode 114 and the ground electrode 116, the actuator is driven in so-called shear mode, whereby a thickness sliding motion is produced in the direction parallel to the direction of polarization, thus causing the piezoelectric layer 110 to deform.

Of the diaphragm 130, at least the surface (front surface) where the piezoelectric layer 110 is formed is an insulating layer (for example, a silicon oxide ($SiO_2$) layer). The thickness of the diaphragm 130 is 10 μm, for example. The diaphragm 130 may be formed entirely as an insulating layer, or only the surface of the diaphragm 130 may be an insulating layer.

More specifically, for example, the piezoelectric layer 110 is a layer of a piezoelectric body (for example, lead zirconate titanate (PZT; $Pb(Zr,Ti)O_3$), barium titanate ($BaTiO_3$), or the like. The piezoelectric layer 110 is formed on the surface of the diaphragm 130 by a film formation method (such as a sputtering method) so as to have an orientation in a direction extending substantially perpendicularly with respect to the plane of the diaphragm 130, from the plane of the diaphragm 130 to the surface where the address electrode 114 and the ground electrode 116 are formed (arrow A10 in (b) of FIG. 4). The film thickness of the piezoelectric layer 110 is desirably equal to or less than approximately 5 μm, in order to cause an electric field to act throughout the piezoelectric layer 110 in the direction of the film thickness.

As shown in (a) of FIG. 4, the address electrode 114 is formed on a region on the surface of the piezoelectric layer 110 which overlaps with the central portion of the pressure chamber 118. The ground electrode 116 is formed so as to overlap with the marginal portion which is the non-central portion of the pressure chamber 118 (the region in the vicinity of the pressure chamber plate 128 (pressure chamber partition)).

A wire (for example, a flexible cable) 126 and a wire 136 are connected to the address electrode 114 and the ground electrode 116 respectively. A voltage is applied to the address electrode 114 from the head driver 82, via this external wire 126. The ground electrode 116 is earthed via the external wire 136.

When a voltage (for example, a positive voltage) is applied to the address electrode 114, an electric field is generated in the direction A12 from the address electrode 114 toward the ground electrode 116 (the direction perpendicular to the direction of polarization A10). By this means, the piezoelectric layer 110 is displaced, the diaphragm 130 is deformed in a projected fashion in the upper direction in the diagram, and the ink is drawn into the pressure chamber 118 from an ink storing and loading unit 14 via a common flow channel (reference numeral 122 in FIGS. 10B and 10C). When the application of voltage to the address electrode 114 is halted, the diaphragm 130 reverts to the shape shown in (b) of FIG. 4, and the ink is ejected from the nozzle 124.

In the present embodiment, the shape of the address electrode 114, the ground electrode 116 and the pressure chamber 118 is an oval shape, but other shapes (for example, a circular shape, square shape or polygonal shape) are also possible. Desirably, the planar shape of the pressure chamber 118 is substantially similar to the planar shape of the address electrode 114 and the ground electrode 116, and the centers of the pressure chamber 118, the address electrode 114 and the ground electrode 116 coincide with each other. By this means, an electric field can be made to act in a substantially uniform manner on the region of the piezoelectric layer 110 on the side of the central portion of the pressure chamber 118, and a pressure can be applied in a substantially uniform manner to the pressure chamber 118.

Figure 5:
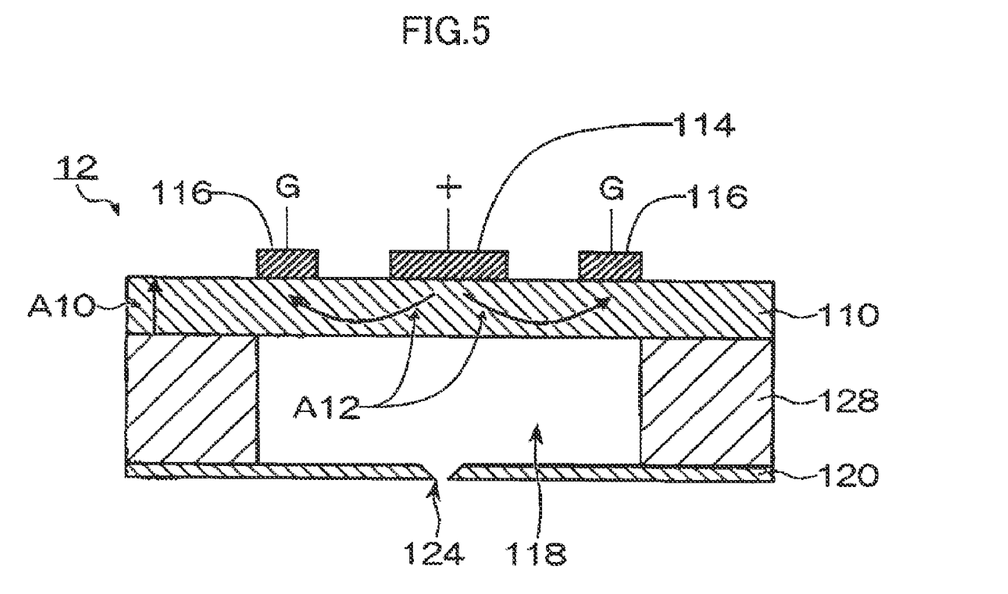
FIG. 5 is a diagram showing a liquid ejection head according to further embodiment of the present invention.

As shown in FIG. 5, it is also possible to from the piezoelectric layer 110 as a wall face of the pressure chamber 118 and to omit the diaphragm 130. In this case, the piezoelectric layer 110 is not constricted by the diaphragm 130 and therefore the amount of displacement of the piezoelectric layer 110 can be increased further.

Properties and Durability of Piezoelectric Layer

The piezoelectric layer 110 relating to the present embodiment is constituted by a piezoelectric body formed so as to have orientation by sputtering. Below, the properties of a piezoelectric body (practical example) formed so as to have orientation by sputtering are described in comparison with a piezoelectric ceramics (comparative example) formed by a ceramics calcination method. The conditions for forming the piezoelectric body relating to the present embodiment by sputtering are 500 W power, gas pressure 1.0 Pa, and substrate temperature 550° C.

A piezoelectric body (embodiment) formed so as to have orientation by sputtering has a low content ratio of air holes and a narrow interface gap in the direction of growth of the film (vertical direction). Therefore, a piezoelectric body (practical example) formed so as to have orientation by sputtering has properties which make it less liable to pass electric current in comparison with a piezoelectric ceramics (comparative example) formed by a ceramics calcination method.

Figure 6:
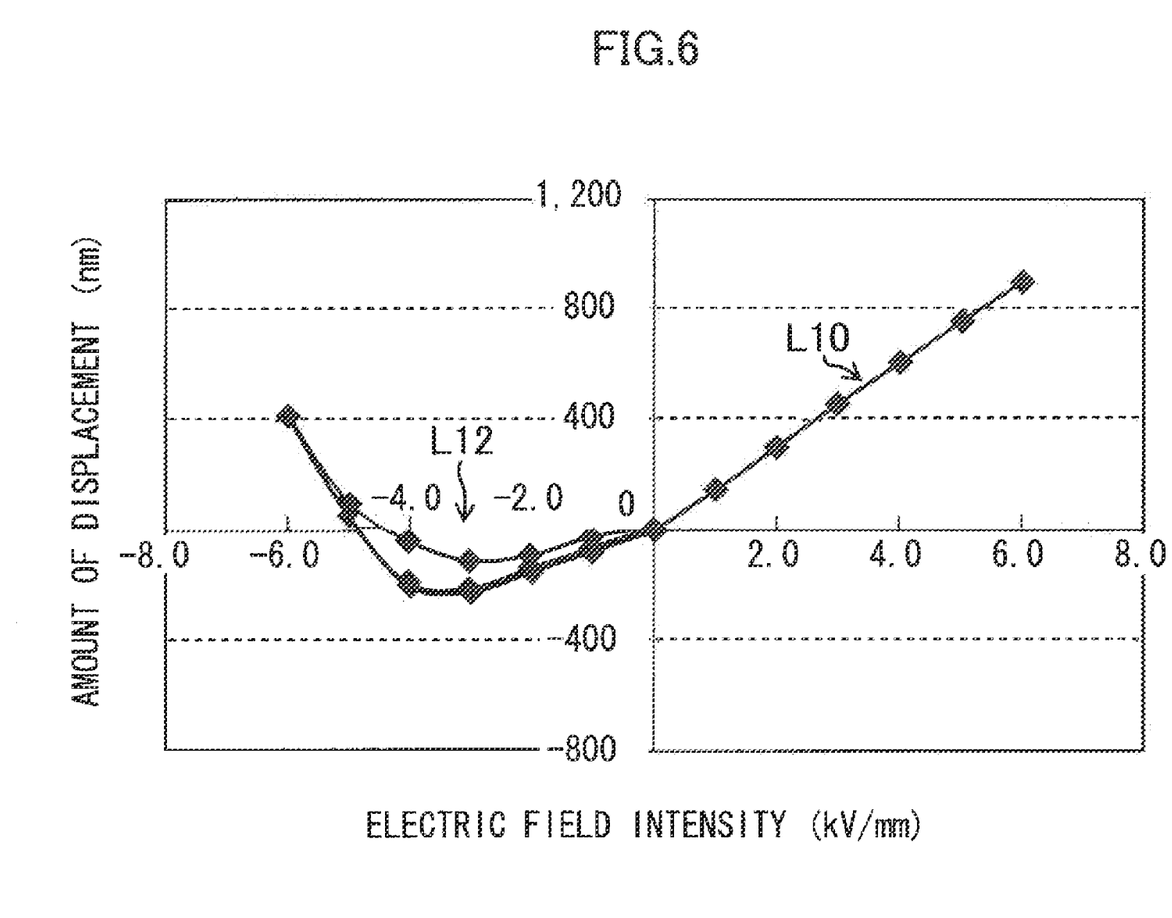
FIG. 6 is a graph showing the relationship between the electric field intensity of a piezoelectric body (embodiment) formed so as to have orientation by sputtering and the amount of displacement.
Figure 7:
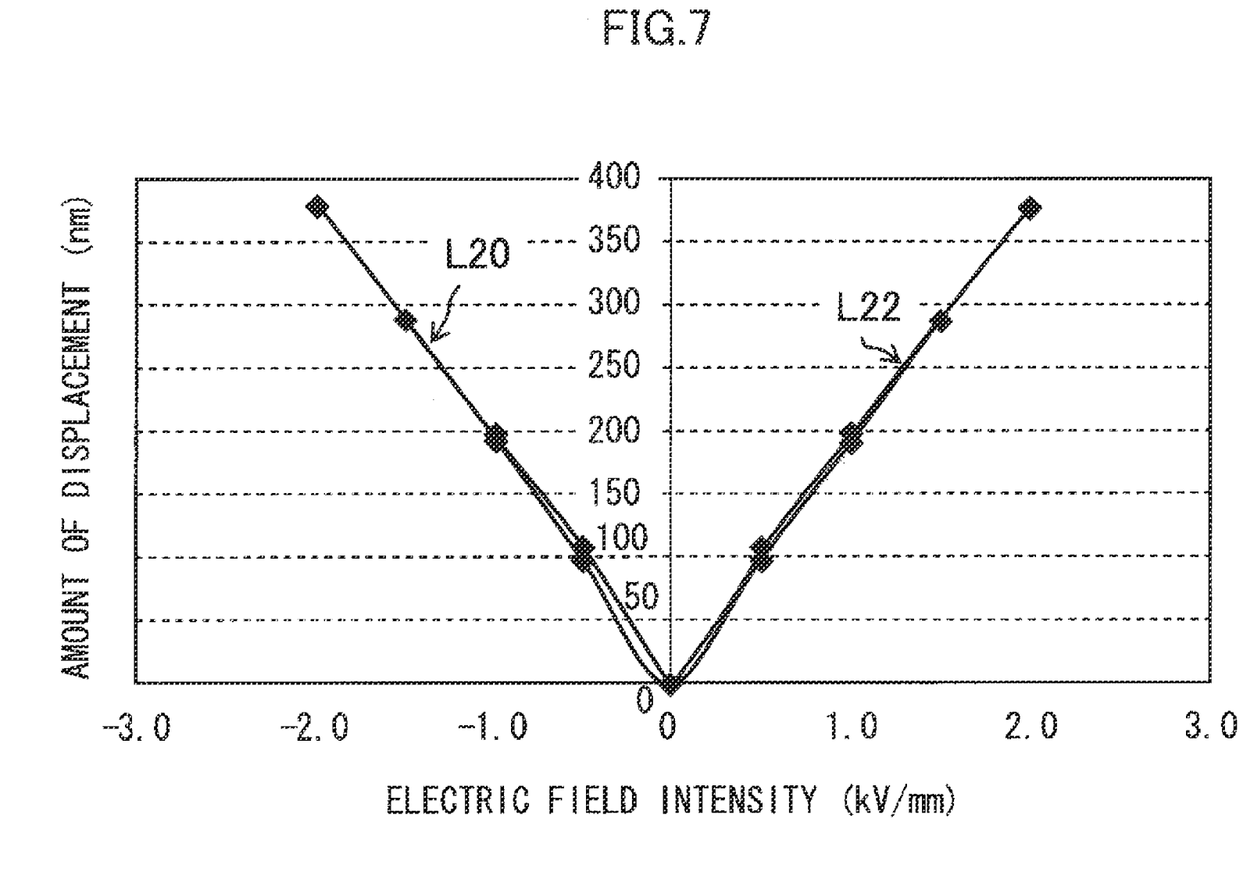
FIG. 7 is a graph showing the relationship between the electric field intensity of a piezoelectric ceramics (comparative example) formed by calcination of ceramic, and the amount of displacement.

FIG. 6 is a graph showing the relationship between the electric field intensity and the amount of displacement of a piezoelectric body (practical example) formed so as to have orientation by sputtering. FIG. 7 is a graph showing the relationship between the electric field intensity and the amount of displacement of a piezoelectric ceramics (comparative example) formed by a ceramics calcinations method. In FIG. 6 and FIG. 7, the horizontal axis indicates the electric field intensity (kV/mm) and the vertical axis indicates the amount of displacement of the piezoelectric body (nm).

As shown in FIG. 7, the piezoelectric ceramics (comparative example) formed by calcination of ceramics displays a positive amount of displacement when the electric field intensity is positive (in other words, when an electric field is applied in the same direction as the direction of polarization of the piezoelectric ceramic), and the amount of displacement in this case becomes larger in direct proportion to the electric field intensity (the region indicated by reference numeral L22 in FIG. 7). On the other hand, if the electric field intensity is negative (in other words, if an electric field is applied in the direction opposite to the direction of polarization of the piezoelectric ceramics), then the direction of polarization of the piezoelectric ceramics changes (reverses), and the amount of displacement of the piezoelectric ceramics is positive, similarly to when the electric field intensity is positive, and the amount of displacement in this case becomes greater in direct proportion to the absolute value of the electric field intensity (the region indicated by reference numeral L20 in FIG. 7). In this way, the piezoelectric ceramics according to the comparative example has properties whereby the direction of polarization becomes liable to change when an electric field is applied in a different direction to the direction of polarization.

On the other hand, as shown in FIG. 6, the piezoelectric body (practical example) formed by sputtering displays a positive amount of displacement when the electric field intensity is positive (in other words, when an electric field is applied in the same direction as the direction of polarization of the piezoelectric body), and the amount of displacement of the piezoelectric body in this case becomes larger in direct proportion to the absolute value of the electric field intensity (the region indicated by reference numeral L10 in FIG. 6). On the other hand, if the electric field intensity is negative (in other words, when an electric field is applied in the direction opposite to the direction of polarization of the piezoelectric body), then in the region of low electric field intensity (approximately 3.0 kV/mm or less), the amount of displacement of the piezoelectric body becomes negative (the region indicated by reference numeral L12 in FIG. 6). This is because the direction of polarization of the piezoelectric body is maintained, even if an electric field is applied in a direction opposite to the direction of polarization of the piezoelectric body. On the other hand, if the value of the electric field intensity exceeds a prescribed value (approximately 3.0 kV/mm or above), then the direction of polarization changes (reverses), and the amount of displacement of the piezoelectric body gradually changes to the positive side. As describe above, a piezoelectric body formed by sputtering has properties whereby the direction of polarization is not liable to change compared to the comparative example, even if an electric field is applied in a direction that is different to the direction of polarization of the piezoelectric body.

In the example shown in FIG. 6, the direction of the electric field is opposite to the direction of polarization of the piezoelectric body, but even if an electric field is applied in a direction perpendicular to the direction of polarization of the piezoelectric body, a piezoelectric body formed by sputtering still has properties which display less liability to change in the direction of polarization compared to the piezoelectric ceramics according to the comparative example.

Figure 8:
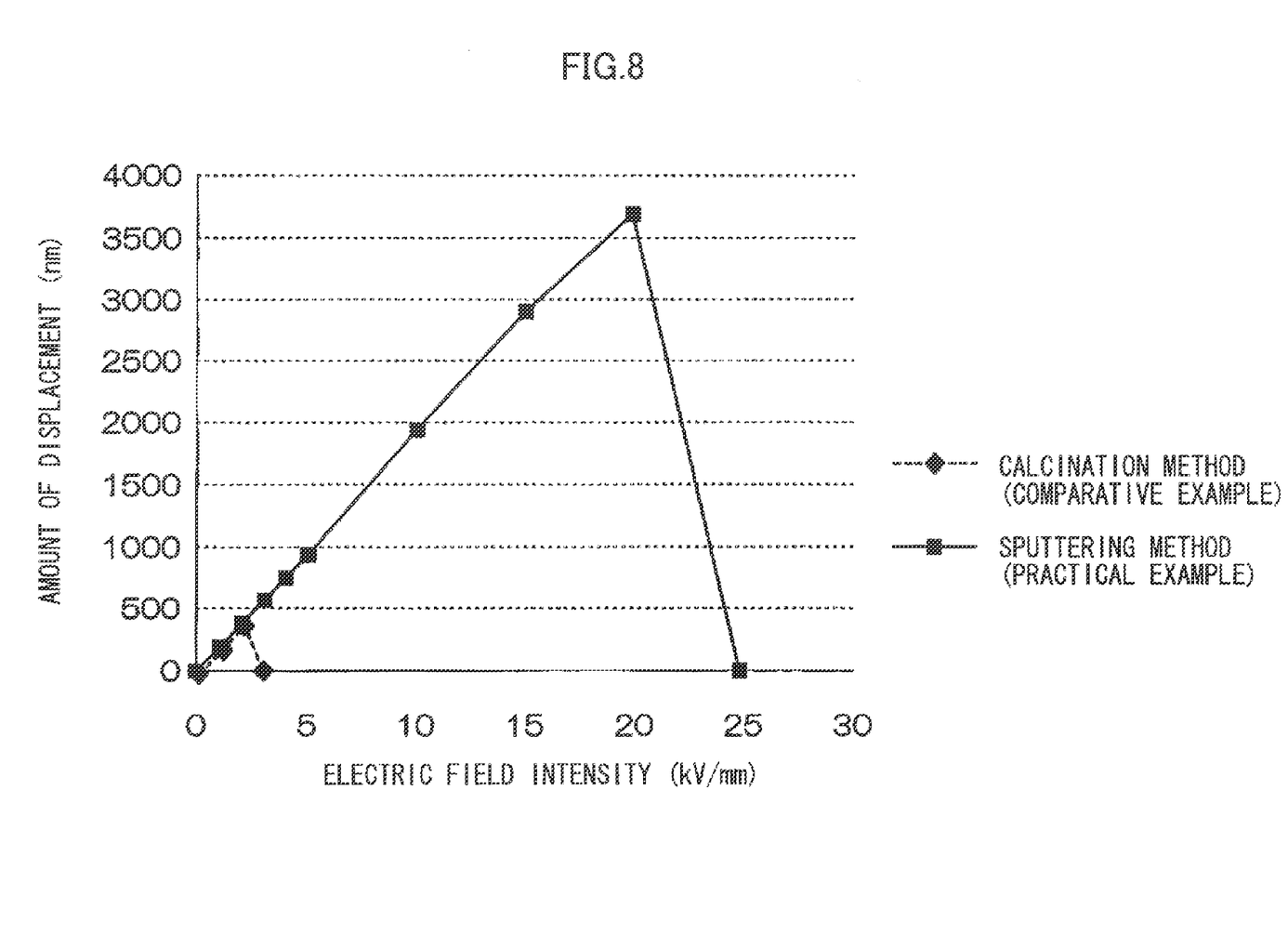
FIG. 8 is a graph showing the durability of a piezoelectric body (embodiment) formed so as to have orientation by sputtering and a piezoelectric ceramics (comparative example) formed by calcination of ceramic.

FIG. 8 is a graph showing the durability of a piezoelectric body (practical example) formed so as to have orientation by sputtering and a piezoelectric ceramics (comparative example) formed by calcination of ceramic. In FIG. 8, the horizontal axis indicates the electric field intensity (kV/mm) and the vertical axis indicates the amount of displacement of the piezoelectric body (nm).

As shown in FIG. 8, the piezoelectric ceramics of the comparative example breaks down at approximately 3.0 kV/mm, whereas the piezoelectric body according to the present embodiment breaks down at approximately 25 kV/mm. In other words, the piezoelectric body relating to the present embodiment displays a voltage tolerance approximately ten times that of the piezoelectric ceramics according to the comparative example.

According to the present embodiment, by employing a piezoelectric body formed so as to have orientation by a film formation method (for example, a sputtering method) in the liquid ejection head 12 using a shear mode, it is possible to prevent the direction of polarization from changing readily even when the piezoelectric body is driven repeatedly. Consequently, it is possible to achieve a piezoelectric actuator having high durability and a stable amount of displacement of the diaphragm, and a liquid ejection head comprising this piezoelectric actuator. Moreover, the piezoelectric body formed so as to have orientation by sputtering has high voltage tolerance and therefore the voltage applied to the piezoelectric actuator 134 can be raised (for example, 3 kV/mm or above, 25 kV/mm or lower) in order to increase the amount of displacement of the diaphragm 130.

Method of Manufacturing Liquid Ejection Head

FIGS. 9A to 9D and FIGS. 10A to 10C are cross-sectional diagrams showing steps of a method of manufacturing a liquid ejection head comprising a piezoelectric actuator relating to one embodiment of the present invention.

Figure 9A:
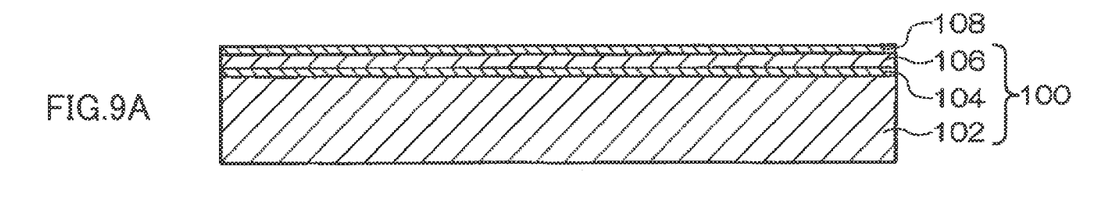
FIGS. 9A to 9D are cross-sectional diagrams showing the steps of a method of manufacturing a liquid ejection head comprising a piezoelectric actuator relating to one embodiment of the present invention.

Firstly, an SOI (Silicon on Insulator) substrate 100 having an insulating layer 108 formed on the surface thereof (the upper surface in the drawings) is prepared (FIG. 9A). The SOI substrate 100 is a multiple-layer substrate which comprises a supporting layer 102 constituted by a silicon substrate (Si substrate), a box layer 104 constituted by a silicon oxide film ($SiO_2$), and an active layer 106 constituted by a silicon substrate (Si substrate). The insulating layer 108 is a silicon oxide film ($SiO_2$ film), for example, and is formed, for instance, by a thermal oxidation method, sputtering, or chemical vapor deposition (CVD). As the material of the insulating layer 108, apart from the silicon oxide described above, it is also possible to use an oxide such as $ZrO_2$, $Al_2O_3$, or the like, a nitride, such as SiCN, TiAlN, $Si_3N_4$, TiAlCrN, or the like, an oxynitride such as SiON, or a resin.

Figure 9B:
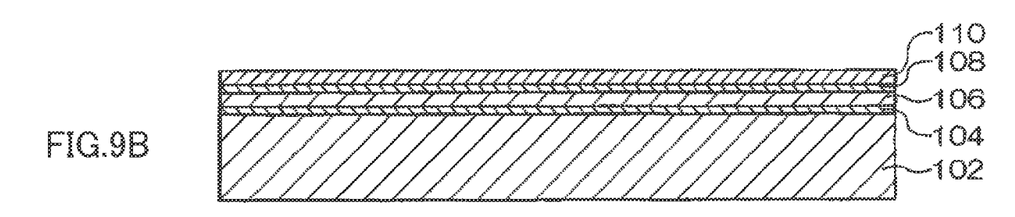

Next, a piezoelectric layer 110 is formed on the surface (the upper surface in the drawings) of the insulating layer 108 (FIG. 9B). The piezoelectric layer 110 is a layer of piezoelectric material (for example, lead zirconate titanate (PZT; $Pb(Zr,Ti)O_3$) or barium titanate ($BaTiO_3$)) and is formed so as to have orientation by a film forming method (such as sputtering), on the surface of the insulating layer 108. By this means, the piezoelectric layer 110 is polarized in a direction perpendicular to the plane of the insulating layer 108 (diaphragm 130). The sputtering conditions in the step in FIG. 9B are, for example, power 500 W, gas pressure 1.0 Pa, and substrate temperature 500° C. or above (550° C.). The film thickness of the piezoelectric layer 110 is desirably equal to or less than approximately 5 μm, in order to cause an electric field to act throughout the piezoelectric layer 110 in the direction of the film thickness.

Figure 9C:
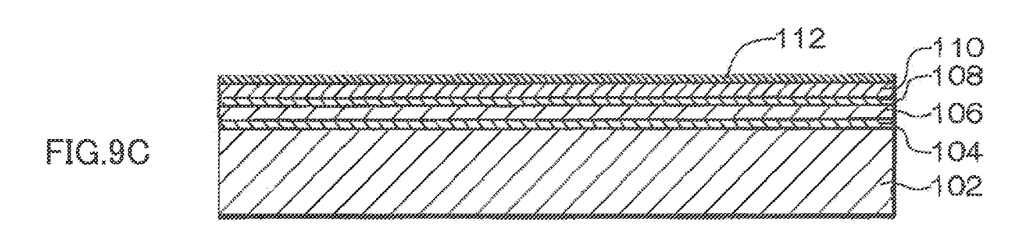

Thereupon, an upper electrode film 112 is formed on the surface of the piezoelectric layer 110 (FIG. 9C). The material of the upper electrode film 112 is, for example, Ir, Pt, Ti or an alloy (Ti—Ir, TiW—Ir, Ti—Pt or TiW—Pt). The method of forming an upper electrode film 112 (film formation method) is a sputtering method, for instance. The thickness of the upper electrode film 112 is 100 to 300 nm, for example.

Figure 9D:
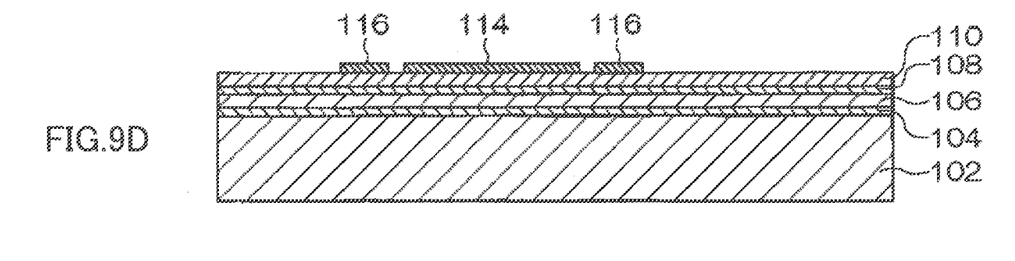

Next, the upper electrode film 112 is patterned, and an address electrode 114 and a ground electrode 116 are formed (FIG. 9D). At the step shown in FIG. 9D, for example, the upper electrode film 112 is patterned by dry etching (RIE) or wet etching using a fluorine gas or chlorine gas, and employing an organic film or metal film as a mask. The substrate temperature during etching is 150° C., for example.

Next, a wiring layer (reference numeral 136 in (a) of FIG. 4) connected to the ground electrode 116 is formed on the surface of the piezoelectric layer 110. The substrate temperature during formation of the wiring layer is 200 to 350° C., for example. The ground electrode 116 is earthed via the wire 136.

Figure 10A:
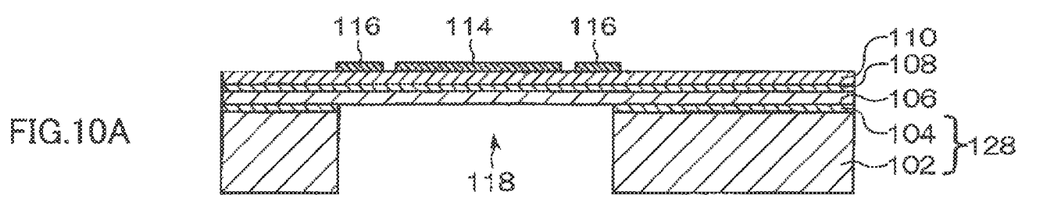
FIGS. 10A to 10C are cross-sectional diagrams showing the steps of a method of manufacturing a liquid ejection head comprising a piezoelectric actuator relating to one embodiment of the present invention (as a continuation of FIGS. 9A to 9D).

Furthermore, the silicon substrate 102 is etched by using the silicon oxide layer 104 as an etching stopper, thereby forming a pressure chamber 118 (FIG. 10A). The silicon substrate 102 and the silicon oxide layer 104 in which the pressure chamber 118 is formed are called a pressure chamber plate 128. Furthermore, the silicon active layer 106 and the insulating layer 108 are called a diaphragm 130.

Figure 10B:
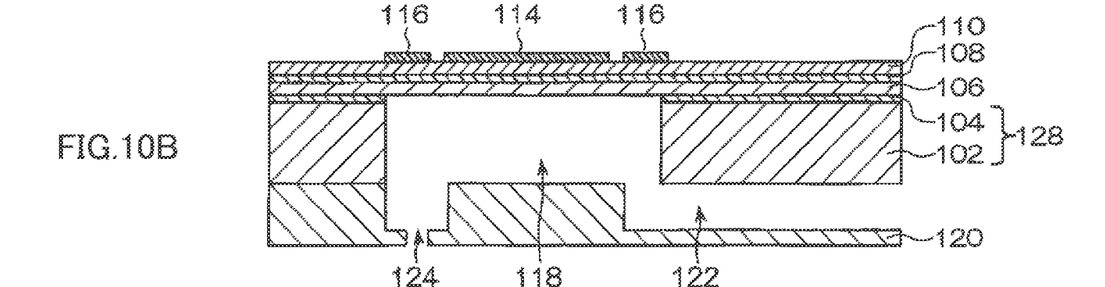

Next, a nozzle plate 120 is bonded to the lower surface of the pressure chamber plate 128 in the drawings (FIG. 10B). By this means, an ink flow channel is formed whereby the ink stored in the ink storing and loading unit 14 is supplied to the pressure chamber 118 via the common flow channel 122, and then arrives at the nozzle 124 via the pressure chamber 118.

Figure 10C:
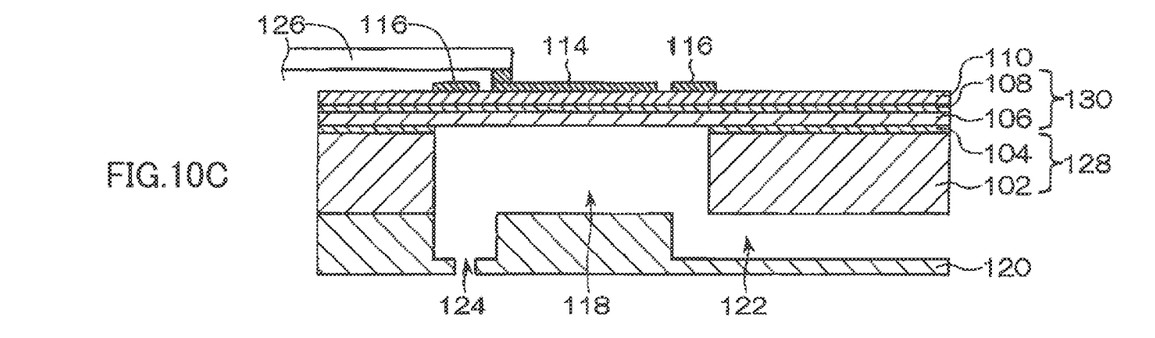

Next, a flexible wire 126 is bonded to the address electrode 114 (FIG. 10C). Consequently, the diaphragm 130 is deformed by the voltage applied to the address electrode 114, and a liquid ejection head 12 which ejects ink inside the pressure chamber 118 is created.

The present invention can also be applied to liquid ejection heads other than a liquid ejection head which ejects ink as described above (for example, a liquid ejection head for forming a fine wiring pattern on a substrate by ejecting conductive paste, a liquid ejection head for forming a high-definition display by ejecting organic light-emitting material onto a substrate, or a liquid ejection head for forming a fine electronic device such as an optical waveguide, by ejecting optical resin onto a substrate.)

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric actuator, comprising:
   a piezoelectric layer formed by a film formation method so as to have a polarization orientation of the piezoelectric layer in a prescribed orientation direction; and
   a pair of electrodes, disposed on a same surface which is substantially perpendicular to the prescribed orientation direction of the piezoelectric layer, for applying to the piezoelectric layer an electric field in a direction substantially perpendicular to the prescribed orientation direction.

2. The piezoelectric actuator as defined in claim 1, wherein:
   the piezoelectric layer is provided on a diaphragm; and
   the pair of electrodes is disposed on a surface on an opposite side of the piezoelectric layer from the diaphragm.

3. The piezoelectric actuator as defined in claim 2, wherein, of the diaphragm, at least a surface on which the piezoelectric layer is disposed has an insulation property.

4. The piezoelectric actuator as defined in claim 1, wherein the pair of electrodes includes an inner electrode and an outer electrode provided so as to encompass the inner electrode.

5. The piezoelectric actuator as defined in claim 4, wherein a central location of the inner electrode coincides with a central location of the outer electrode.

6. A liquid ejection head, comprising:

a plurality of pressure chambers disposed in a plane; and piezoelectric actuators which change volume of the plurality of pressure chambers respectively so as to apply pressure to liquid inside the plurality of pressure chambers respectively, wherein the piezoelectric actuators each have:

a piezoelectric layer formed by a film formation method so as to have a polarization orientation of the piezoelectric layer in a prescribed orientation direction; and a pair of electrodes, disposed on a same surface which is substantially perpendicular to the prescribed orientation direction of the piezoelectric layer, for applying to the piezoelectric layer an electric field in a direction substantially perpendicular to the prescribed orientation direction.

7. The liquid ejection head as defined in claim 6, wherein the piezoelectric layer is provided on a diaphragm;

the pair of electrodes is arranged on a surface on an opposite side of the piezoelectric layer from the diaphragm; and the diaphragm constitutes one wall face of the plurality of pressure chambers.

8. The liquid ejection head as defined in claim 7, wherein, of the diaphragm, at least a surface on which the piezoelectric layer is disposed has an insulation property.

9. The liquid ejection head as defined in claim 6, wherein the piezoelectric layer constitutes one wall face of the plurality of pressure chambers.

10. The liquid ejection head as defined in claim 6, wherein the pair of electrodes comprises a ring-shaped first electrode having a substantially similar shape to a corresponding pressure chamber when viewed from a face perpendicular to the plane, and a second electrode arranged on an inner side of the first electrode when viewed from the face perpendicular to the plane.

11. The liquid ejection head as defined in claim 6, wherein the pair of electrodes includes:

an inner electrode provided on a first region of the piezoelectric layer which corresponds to a central region of a corresponding pressure chamber; and an outer electrode provided on a second region of the piezoelectric layer which corresponds to a region other than the central region of the corresponding pressure chamber.

12. The liquid ejection head as defined in claim 6, wherein, when viewed in a direction perpendicular to the plane, a shape of each of the plurality of pressure chambers is substantially similar to a shape of the pair of electrodes.

13. An image forming apparatus, comprising:

the liquid ejection head defined in claim 6;

a voltage application device which applies a voltage to the pair of electrodes; and a voltage control device which controls the voltage applied to the pair of electrodes in such a manner that intensity of an electric field generated in the piezoelectric element is 3 kV/mm or greater and 25 kV/mm or lower.

* * * * *